(12) United States Patent
Pritelli et al.

(10) Patent No.: US 9,966,942 B2
(45) Date of Patent: May 8, 2018

(54) SOLID-STATE RELAY INCLUDING AN ELECTRONIC CURRENT DETECTION BLOCK

(71) Applicant: Magneti Marelli S.P.A., Corbetta, Milan (IT)

(72) Inventors: Danilo Pritelli, Bologna (IT); Rosanna Suglia, Bologna (IT); Franco Ciampolini, Bologna (IT); Gianluca Aurilio, Caserta (IT)

(73) Assignee: Magneti Marelli S.P.A., Corbetta (IT)

( * ) Notice: Subject to any disclaimer, the term of this patent is extended or adjusted under 35 U.S.C. 154(b) by 215 days.

(21) Appl. No.: 15/012,098

(22) Filed: Feb. 1, 2016

(65) Prior Publication Data
US 2016/0226485 A1   Aug. 4, 2016

(30) Foreign Application Priority Data
Feb. 2, 2015   (IT) .............................. MI2015A0133

(51) Int. Cl.
*H03K 17/687*   (2006.01)
*B60L 11/18*   (2006.01)
(Continued)

(52) U.S. Cl.
CPC ............ *H03K 17/687* (2013.01); *B60L 11/18* (2013.01); *B60L 11/1851* (2013.01); *H02H 3/087* (2013.01); *H02H 7/18* (2013.01)

(58) Field of Classification Search
CPC . H03K 17/687; B60L 11/1851; B60L 11/182; H02H 3/087; H02H 7/18
See application file for complete search history.

(56) References Cited

U.S. PATENT DOCUMENTS 4,816,963 A * 3/1989 Eden ................... H03K 17/0822
330/207 P
7,468,895 B1 * 12/2008 Rewinkel .......... H02M 3/33507
250/551

(Continued)

OTHER PUBLICATIONS

Search Report for Italian Application No. 102015902327130 (MI2015A000133) dated Sep. 28, 2015.

*Primary Examiner* — Daniel Kessie
(74) *Attorney, Agent, or Firm* — Howard & Howard Attorneys PLLC

(57) ABSTRACT

The present invention relates to a solid-state relay including a power semiconductor switch device connected between a first electrical terminal and a second electrical terminal and having a command terminal. An electronic driving block is adapted to generate a command signal applied to the command terminal to switch the at least one semiconductor switch device from a closed/open state to an open/closed state to disconnect/connect the first electrical circuit portion from/to the second portion of the electrical circuit. An electronic block detects a current which crosses the power semiconductor switch device. The electronic detection block includes a first electronic device adapted to generate a first signal indicative of a difference of potential between the first and second terminals generated by the current which crosses a total resistance present between the first and second terminals of the power semiconductor switch device in the closed state. The total resistance comprises the sum of a first resistance associated with the semiconductor switch device in the closed state and of second bonding resistances associated with an electrical connection between one of the conductive terminals and the respective either first or second electrical terminal.

21 Claims, 5 Drawing Sheets

(51) Int. Cl.
*H02H 3/087* (2006.01)
*H02H 7/18* (2006.01)

(56) References Cited

U.S. PATENT DOCUMENTS

| | | | |
|---|---|---|---|
| 9,702,910 B2* | 7/2017 | Baldridge | G01R 21/06 |
| 2002/0036910 A1* | 3/2002 | Yang | H02M 3/33507 |
| | | | 363/21.07 |
| 2003/0142515 A1* | 7/2003 | Kim | B41J 29/393 |
| | | | 363/21.15 |
| 2006/0007626 A1 | 1/2006 | Ohshima | |
| 2010/0110599 A1 | 5/2010 | Ohshima | |
| 2010/0118461 A1* | 5/2010 | Ohshima | G05F 1/573 |
| | | | 361/86 |
| 2011/0062876 A1* | 3/2011 | Yang | H05B 33/0851 |
| | | | 315/219 |
| 2013/0113439 A1* | 5/2013 | Mack | H01M 10/0525 |
| | | | 320/163 |
| 2013/0215651 A1* | 8/2013 | Liao | H02M 5/40 |
| | | | 363/34 |
| 2013/0332750 A1 | 12/2013 | Souma | |

* cited by examiner

SOLID-STATE RELAY INCLUDING AN ELECTRONIC CURRENT DETECTION BLOCK

CROSS-REFERENCE TO RELATED APPLICATIONS

The present application claims priority to and all the benefits of Italian Patent Application No. 102015902327130, filed on Feb. 2, 2015, which is hereby expressly incorporated herein by reference in its entirety.

BACKGROUND OF THE INVENTION

1. Field of the Invention

The present invention relates to electrically actuated switching devices or relays. In particular, the invention relates to a solid-state relay electrically actuated to open/close an electrical circuit in response to a control signal to disconnect/connect a first portion of an electrical circuit from/to a second portion of such a circuit. Particularly, but in a non-limiting manner, the invention relates to an electronic solid-state relay which can be used to electrically disconnect/connect an electric charge storage device or battery for electric or hybrid traction motor vehicles from/to a load.

2. Description of the Related Art

In applications in the automotive field, in particular in electric or hybrid traction vehicles, each motor vehicle is equipped with a source of electric charge or electric charge storage device or battery adapted to store the electrical energy used also for traction. Movement system for an electric or hybrid vehicle typically includes a loading assembly, in particular an electric motor adapted to generate the motion, driven by an inverter, which is electrically connected to a battery pack or assembly for storing the electrical energy. In particular, the electrical connection between the inverter and the battery pack is achieved by a direct current (DC) bus, generally referred to as DC-BUS or HV DC BUS by those skilled in the art.

The battery pack particularly comprises an electrochemical cell block adapted to supply the desired voltage and capacitance to the terminals of the direct current bus. The battery pack cells can be electrically disconnected from the loading assembly by the isolation devices, in particular relays.

In the automotive field, it is known to construct such relays by electromechanical devices, in particular for high currents, controlled by a Battery Management System or BMS, generally housed inside the battery pack itself. Such electromechanical relay devices for high currents used in the automotive field are not free from drawbacks.

Indeed, such relays have a large, heavy structure, comprising moving mechanical parts, which increases the size and overall weight of the battery system with which they are associated. Moreover, the presence of moving mechanical parts which are subject to deterioration over time or particular operating working conditions, such as for example the opening of the relay itself in the presence of high currents, could reduce the lifespan of the relay with respect to the working life of the battery.

Moreover, detecting the current which crosses the electromechanical relay when this is in the closed state is often needed in the movement system of an electric or hybrid traction vehicle. For such a purpose, such a system comprises a current measuring sensor implemented, for example, by a shunt resistor or a Hall effect sensor, associated with the direct current bus and controlled by the Battery Management System BMS. Such a sensor is an additional element of the system which further complicates the structure thereof.

SUMMARY OF THE INVENTION

It is the object of the present invention to provide and make available an electronic solid-state relay electrically actuated to open/close an electrical circuit which allows to overcome, at least partially, the aforesaid drawbacks related to the use of known electromagnetic relay devices for the same purposes.

Such an object is achieved by a solid-state relay comprising at least one power semiconductor switch device connected between a first electrical terminal of the relay connected to said first electrical circuit portion and a second electrical terminal of the relay connected to the second electrical circuit portion, respectively, by respective conductive terminals, and having a command terminal. An electronic driving block is adapted to generate a command signal applied to the command terminal to switch the semiconductor switch device from a closed/open state to an open/closed state to disconnect/connect the first electrical circuit portion from/to the second portion of said electrical circuit. An electronic block detects a current which crosses the power semiconductor switch device. The electronic detection block includes a first electronic device having a first input and a second input connected to the first and second electrical terminals, respectively, and that is adapted to generate a first signal indicative of a difference of potential between the first and second terminals generated by the current which crosses a total resistance present between the first and second terminals of the at least one power semiconductor switch device in the closed state. The total resistance comprises the sum of a first resistance associated with the semiconductor switch device in the closed state and of second bonding resistances each associated with an electrical connection between one of said conductive terminals and the respective either said first or second electrical terminal. The electronic driving block is adapted to receive an opening/closing control signal, to further receive an enabling/disabling signal depending on the first signal, and is further adapted to generate said command signal on the basis of the opening/closing control signal and of the enabling/disabling signal.

The present invention also relates to a movement system for an electric or hybrid vehicle which includes the solid-state relay of the invention comprising at least one power semiconductor switch device that is connected between a first electrical terminal of the relay connected to the first electrical circuit portion and a second electrical terminal of the relay connected to the second electrical circuit portion, respectively, by respective conductive terminals, and having a command terminal. An electronic driving block is adapted to generate a command signal applied to the command terminal to switch the semiconductor switch device from a closed/open state to an open/closed state to disconnect/connect the first electrical circuit portion from/to the second portion of the electrical circuit. An electronic block detects a current which crosses the power semiconductor switch device. The electronic detection block includes a first electronic device having a first input and a second input connected to the first and second electrical terminals, respectively, and that is adapted to generate a first signal indicative of a difference of potential between the first and second terminals generated by the current which crosses a total resistance present between the first and second terminals of the power semiconductor switch device in the closed state.

The total resistance comprises the sum of a first resistance associated with the semiconductor switch device in the closed state and of second bonding resistances each associated with an electrical connection between one of said conductive terminals and the respective either said first or second electrical terminal. The electronic driving block is adapted to receive an opening/closing control signal, to further receive an enabling/disabling signal depending on the first signal, and is further adapted to generate the command signal on the basis of the opening/closing control signal and of the enabling/disabling signal.

BRIEF DESCRIPTION OF THE DRAWINGS

Further features and advantages of the solid-state relay according to the invention will become apparent from the following description which discloses preferred embodiments, given by way of indicative, non-limiting examples, with reference to the accompanying drawings, in which.

DETAILED DESCRIPTION OF THE INVENTION

Figure 1:
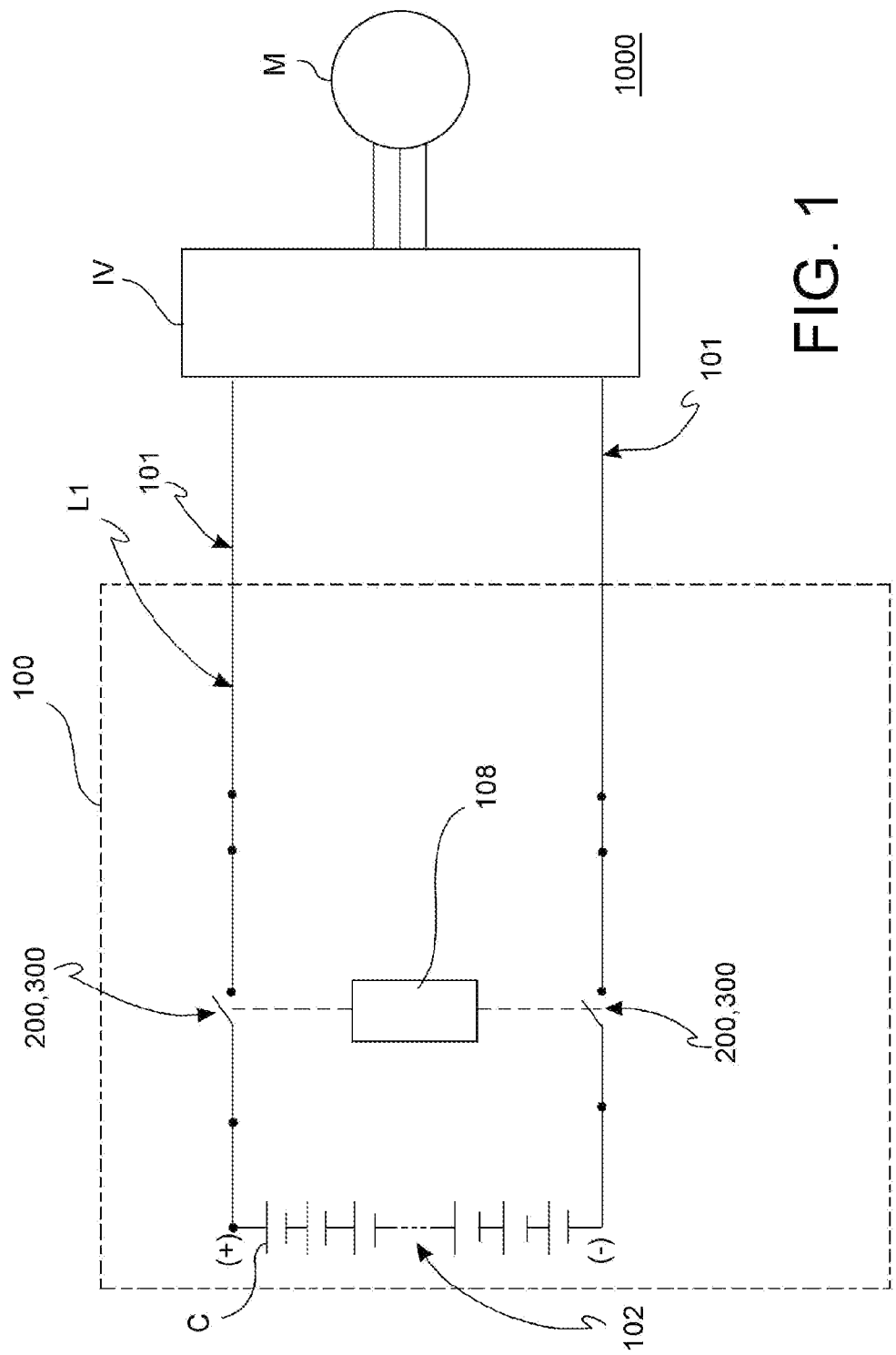
FIG. 1 diagrammatically shows an example of a movement system for an electric or hybrid vehicle.

Similar or equivalent elements in the aforesaid figures are indicated by the same reference numerals.

Although, below in the description, reference will be made by way of example to the scope of application of movement systems for electric or hybrid traction vehicles, the electronic solid-state relay of the present invention can also advantageously be used in other fields in which a first portion of an electrical circuit must be disconnected/connected in a controlled manner from/to a second portion of such a circuit.

With reference to FIG. 1, a movement system 1000 of an electric or hybrid traction vehicle comprises a loading assembly, in particular an electric motor M, e.g. a three-phase motor, adapted to generate the motion, driven by an inverter IV, which is electrically connected to an electric charge source assembly or battery pack 100 for storing the electrical energy. In particular, the electrical connection between the inverter IV and the battery pack 100 is achieved by use of a direct current (DC) bus 101, referred to as DC-BUS or HV DC BUS by those skilled in the art.

In greater detail, the battery pack 100 comprises a block 102 of electrochemical cells C, typically lithium ion cells, which are similar to one another and interconnected in a serial configuration adapted to supply the desired voltage and capacitance to the terminals of the direct current bus 101.

Such a cell block 102 of the battery pack 100 can be electrically disconnected/connected from the direct current bus 101, and thus from/to the inverter IV of the loading assembly, by use of isolation relays, in particular electronic solid-state relays 200, 300 according to the present invention.

FIG. 1 shows, for example, two solid-state relays 200, 300, but the movement system 1000 of an electric or hybrid traction vehicle may also comprise a single solid-state relay 200, 300. In such a case, the direct current bus 101 includes a single electric line L1 which connects the positive terminal (+) of the cell block 102 to the inverter IV. Thereby, the solid-state relay 200, 300 is adapted to isolate such a single line L1. The negative terminal (−) of the cell block 102 is, in such a case, directly connected to a reference potential.

Such solid-state relays 200, 300 are controlled by a processing unit or Battery Management System BMS 108, e.g. housed in the battery pack 100 itself. Such a BMS processing unit 108 is of the type known to those skilled in the art and will not be described in further detail below.

Figure 2:
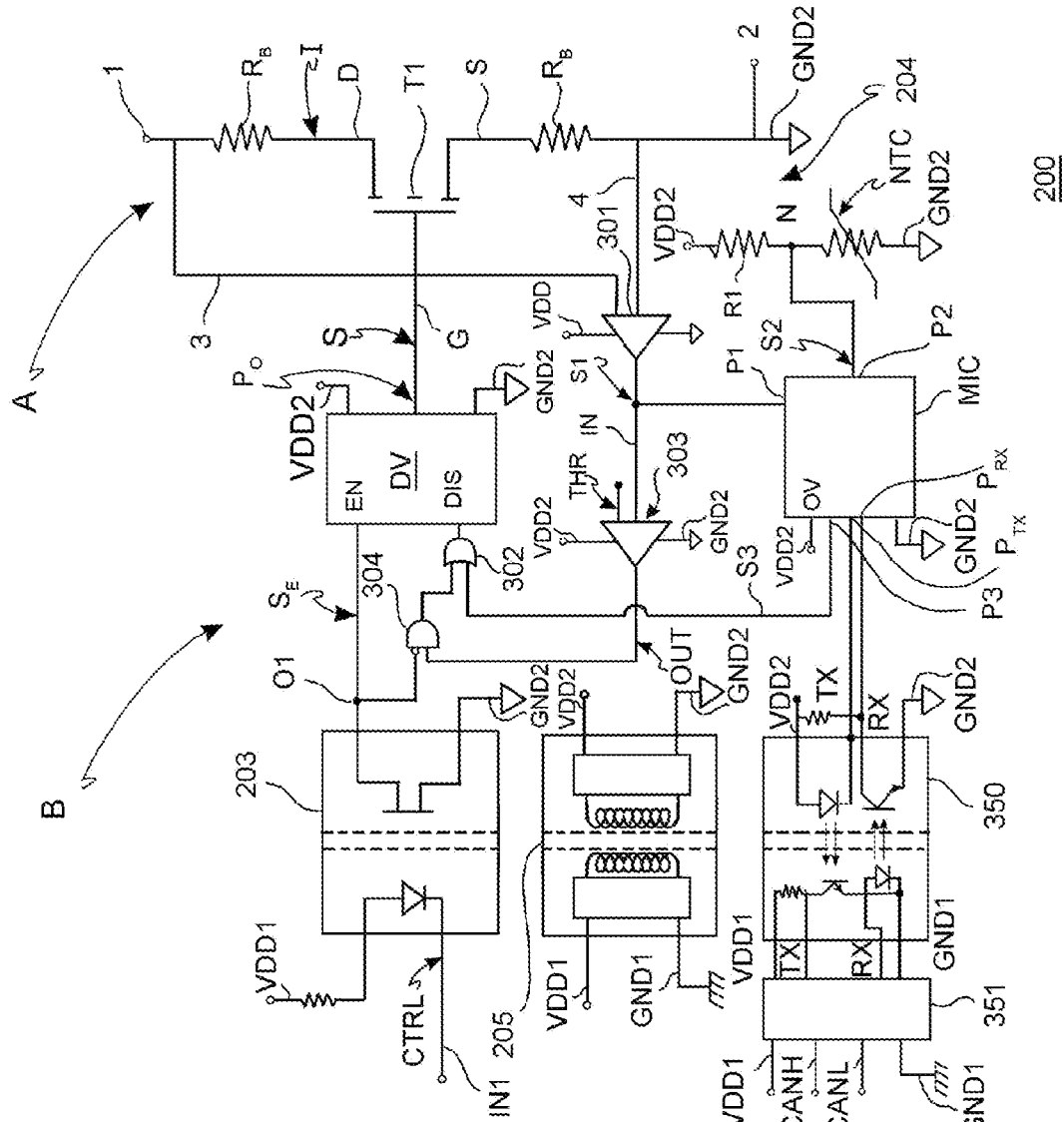
FIG. 2 shows a first embodiment of circuit logic of the solid-state relay of the invention included in the system of FIG. 1.
Figure 3:
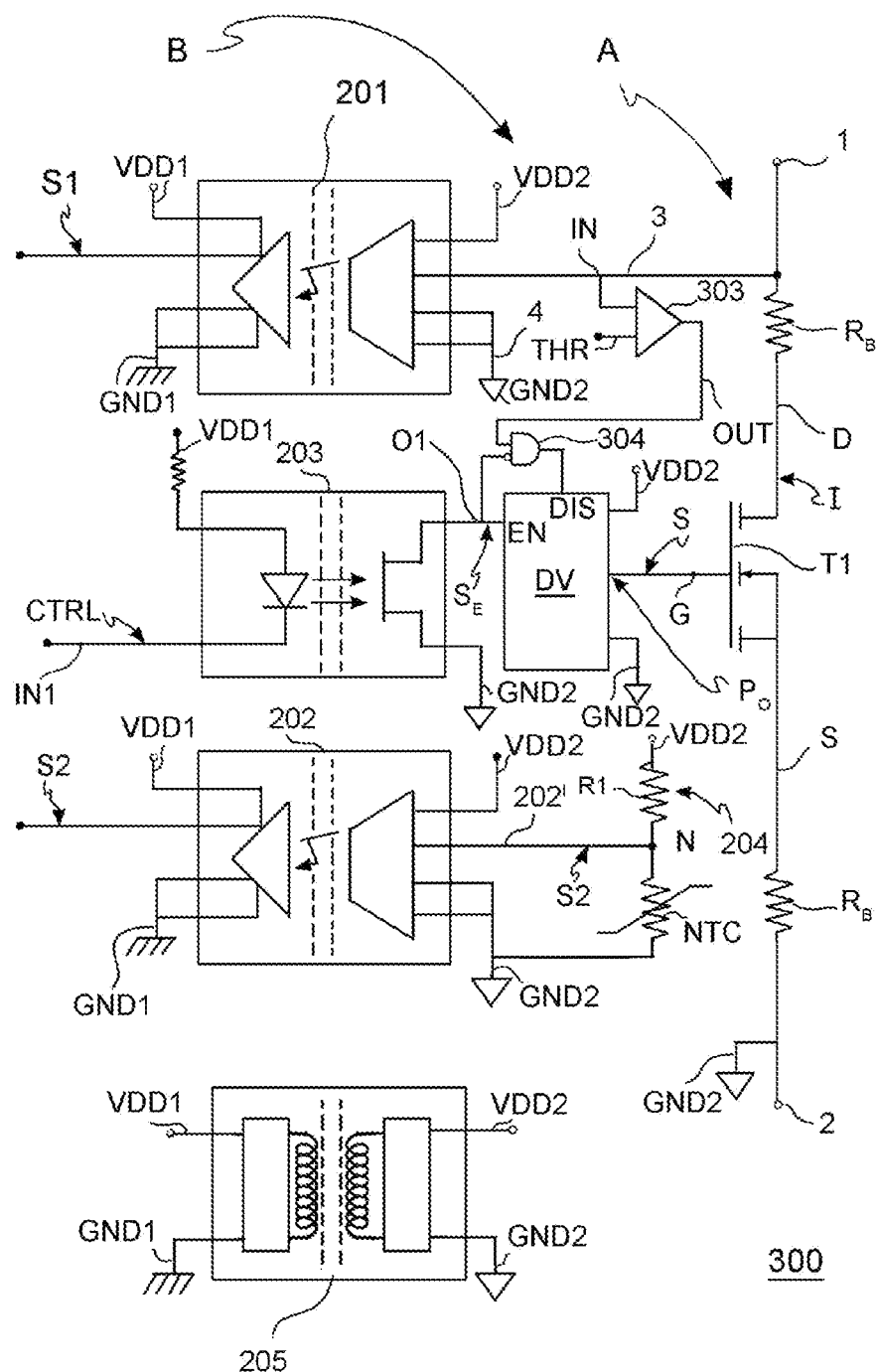
FIG. 3 diagrammatically shows a second embodiment of circuit logic of the solid-state relay of the invention included in the system of FIG. 1.

With reference to FIGS. 2 and 3, it is worth noting that the solid-state relays 200, 300 of the present invention comprise a power circuit portion A isolated from a control circuit portion B which is connectable, by use of opto-couplers, to the aforesaid BMS processing unit 108.

With reference to FIG. 2, in a first embodiment of the solid-state relay of the invention, such a relay 200 comprises at least one power semiconductor switch device T1 connected between a first 1 and a second 2 electrical terminal of the relay. Such a first electrical terminal 1 is connected to a first electrical circuit portion of the above-described movement system 1000, e.g. to the cell block 102 of the battery pack 100. The second electrical terminal 2 is connected to a second electrical circuit portion of the movement system 1000, i.e. to the inverter IV of the loading assembly by use of bus 101.

Such a power semiconductor switch device T1 comprises drain D and source S conductive terminals connected to the first 1 and second 2 terminals of the solid-state relay 200, respectively, by respective welding resistances or bonding resistances $R_B$, and a command terminal or gate terminal G.

It is worth noting that the power semiconductor switch device T1 is the logical switch of the solid-state relay 200. Such a semiconductor switch device may include, for example, one or more power MOSFET devices connected to one another in parallel and/or in series according to the management of the current I which is desired to cross the semiconductor switch device T1 in the closed state (ON). In greater detail, in the case of two power MOSFETs connected to each other in parallel, the total resistance present between the first 1 and second 2 terminals is lower than that of a single MOSFET, which allows to manage a higher current I. If the power semiconductor switch device T1 includes two MOSFETs connected to each other in series, such a device is adapted to interrupt both the current which flows from the cell block 102 towards the inverter IV of the load block and the current which could flow from the inverter IV of the cell block 102, if the inverter itself either is not equipped with respective mechanisms for interrupting such a current (of hardware or software type) in order to interrupt and/or reset the current, or is not programmed to avoid such a possibility from occurring. In a preferred embodiment, the power semiconductor switch device T1 of relay 200 includes two power MOSFETs in parallel fixed to each other by use of metal bonds, to the first 1 and second 2 electrical terminals.

The solid-state relay 200 further comprises an electronic driving block 203, DV of the semiconductor switch device T1 adapted to generate a command signal S applied to the aforesaid command terminal G to switch such a semiconductor switch device T1 from a closed/open state (ON/OFF) to an open/closed state in order to disconnect/connect the cell block 102 from the battery pack 100 from/to the inverter IV of the loading assembly.

As will be disclosed in greater detail below, the electronic driving block 203, DV is adapted to receive an opening/closing control signal $S_E$ and to further receive an enabling/disabling signal which depends on a first signal S1 indicative of a difference of potential between the first 1 and second 2 terminals. The electronic driving block is further adapted to generate the command signal S according to the opening/closing control signal $S_E$ and the aforesaid enabling/disabling signal.

In an embodiment, in the condition in which the opening/closing control signal $S_E$ determines the closed state of the power semiconductor switch device T1, the electronic driving block 203, DV is adapted to disable such a power semiconductor switch device T1 when the enabling/disabling signal is a disabling signal.

In particular, the electronic driving block comprises an opto-isolated driving electronic element 203, of type known to those skilled in the art, having an output terminal O1 connected to an enabling pin EN of a driver device DV. Such a driver device DV is provided with a respective output pin Po connected to the command terminal G of the semiconductor switch device T1. Such a driver device DV, in particular, is provided with logical digital circuits capable of performing, in a manner known per se, the aforesaid functions described above for which the electronic driving block is adapted.

Such an opto-isolated driving element 203 is adapted to supply the opening/closing control digital signal $S_E$, in particular a low level signal (logical 0), on the output terminal O1 to enable the command signal S by the driver device DV on the command terminal G. In greater detail, the opto-isolated driving element 203 is adapted to generate the opening/closing control digital signal $S_E$ (logical 0) based on a control signal CTRL externally applied to the solid-state relay 200, e.g. applied to an input terminal IN1 of the opto-isolated driving element 203. Such a control signal CTRL is, for example, generated by the BMS processing unit 108 (not shown in FIG. 2).

Furthermore, the solid-state relay 200 of the invention comprises an electronic block 301 for detecting a current I which crosses the power semiconductor switch device T1. Such an electronic detection block comprises a first electronic device 301 having a first input 3 and a second input 4 connected to the first 1 and second 2 electrical terminals of relay 200, respectively. In particular, such a first electronic device comprises an operational amplifier 301 adapted to generate the first signal S1, in particular a digital voltage signal, indicative of a potential difference between the aforesaid first 1 and second 2 terminals.

For example, such an operational amplifier 301 has a gain such that an analog differential voltage of several hundreds of millivolts applied to the input of the amplifier 301 is adapted to generate a digital voltage signal in the 0-3 V range.

The aforesaid potential difference between the first 1 and second 2 terminals is generated by the current I which crosses a total resistance Rtot present between the first 1 and second 2 terminals when the semiconductor switch T1 is in the closed state (ON). In detail, such a resistance Rtot comprises (and in an embodiment substantially corresponds to) the sum of the drain-source resistance $R_{DSon}$ of the semiconductor switch device T1 in the closed state and of the bonding resistances $R_B$, i.e. Rtot=$R_{DSon}$+2$R_B$.

It is worth noting that each of the aforesaid bonding resistances $R_B$ is associated with an electrical connection between one of the aforesaid conductive terminals D,S and the respective first 1 or second 2 electrical terminal.

For example, for current values I of approximately 400 Ampere, the value of the drain-source resistance $R_{DSon}$ of the semiconductor switch device T1 in the closed state is approximately 500-700 µOhm and the value of the bonding resistance $R_B$ is approximately circa 200-400 µOhm.

With reference to FIG. 2, it is worth noting that the second input 4 of the optional amplifier 301 and the second terminal 2 of relay 200 are connected to a low reference potential or ground potential GND2.

Moreover, the electronic current detection device I comprises, in an option of embodiment, a respective processing unit MIC operatively associated with the solid-state relay 200 and different from the aforesaid driving block 203, DV. In the example in FIG. 2, such a processing unit MIC is associated with the control circuit portion B of relay 200.

Such a processing unit includes a microcontroller MIC having a first input pin P1 connected to an output of the operational amplifier 301 to receive the aforesaid first signal S1.

The microcontroller MIC is adapted to detect the current I which crosses the semiconductor switch device T1 according to a processing performed on such a first signal S1, as will be described in greater detail below.

The microcontroller MIC further comprises a first output pin P3 connected to one of the two inputs by a first logical port, in particular an OR port 302, in which the respective output is connected to a disabling pin DIS of the driver device DV. For example, such a disabling pin DIS of the driver DV is activated by a high logical level signal (logical 1).

If the microcontroller MIC detects an abnormal operating condition starting from the aforesaid current I, because such a current I is higher than a predetermined maximum value $I_{MAX}$, which impose the switch-off of switch T1, the microcontroller MIC is adapted to generate a respective high level (logical 1) digital signal S3 on the first output pin P3 to be sent to the driver device DV, via the OR logical port 302, to disable the command signal S applied to the command terminal G and to switch off the semiconductor switch device T1.

Thereby, the microcontroller MIC implements an overcurrent protection of the solid-state relay 200 of the invention, in particular a software type protection, i.e. according to the functions of the programming software of the microcontroller MIC itself.

In accordance with an embodiment, the solid-state relay 200 further comprises an electronic temperature detection block 204 connected to a second input pin P2 of the microcontroller MIC. Such an electronic temperature detection block 204 is adapted to generate a second signal S2 indicative of a temperature of the power semiconductor switch device T1.

In particular, such a second signal S2 is made available to the microcontroller MIC on the aforesaid second input pin P2.

In one embodiment, the electronic temperature detection block 204 or temperature sensor includes a thermistor, for example of NTC (Negative Temperature Coefficient) type, connected in series to a further resistor R1 between a power potential VDD2 and a ground reference potential GND2.

An intermediate node N between the thermistor NTC and the further resistor R1 is connected to the second input pin P2 of the microcontroller MIC to make such a second signal S2 available on such a pin.

In an alternative embodiment of the present invention, the microcontroller MIC is adapted to detect the current I which crosses the semiconductor switch device T1 according to a processing performed starting from the first signal S1 and the second signal S2.

Additionally, the solid-state relay 200 comprises an overcurrent protection circuit 303, 304 adapted to disable the command signal S on the command terminal G of the power semiconductor switch device T1 if the current I which crosses switch T1 is higher than the maximum predetermined value $I_{MAX}$. In particular, such an overcurrent protection current 303, 304 of relay 200 intervenes either autonomously or if the aforesaid overcurrent protection intervention of the microcontroller MIC fails to intervene.

Such a protection circuit comprises a comparator device 303, for example an operational amplifier, having a respective first input terminal IN connected to the output of the operational amplifier 301 to receive the aforesaid first signal S1 and a second input terminal adapted to receive a threshold signal THR. Such a comparator 303 comprises a respective output terminal OUT connected to a first input of a second logical port, in particular an AND port 304, the second input of which is connected to the output terminal O1 of the opto-isolated driving element 203. It is worth noting that the second input of the AND port 304 and is adapted to receive the reverse of the logical signal present at the output terminal O1 of the opto-isolated driving element 203.

It is worth noting that such a protection is activated when there is a high logical level signal (logical 1) on the OUT output of comparator 303.

Assuming that when the control signal CTRL is active, the opening/closing control signal $S_E$ is a low logical level signal (logical 0), the comparator 303 is adapted to supply a low logical level signal (logical 0) to the first input of the second AND port 304 if the first signal S1 is lower than the threshold THR. Therefore, the low logical level signal (logical 0) is supplied to the second input of the OR port 302 which keeps the disabling pin DIS of the driver device DV low.

Conversely, if the first signal S1 is higher than the threshold THR, the comparator 303 is adapted to provide a high level signal (logical 1) to the first input of the second AND port 304. Therefore, the logical high level signal (logical 1) is supplied in input to the OR port 302, and thus to the disabling pin DIS of the driver device DV which disables the command signal S.

Such a protection circuit 303, 304 thus implements an overcurrent protection of the solid-state relay 200 of the invention, in particular of the hardware type.

It is worth noting that the overcurrent protection advantageously implemented by the micro MIC and by the protection circuit 303, 304 allows to protect both the solid-state relay 200 and the total circuit of the movement system 1000 of the vehicle.

Furthermore, the solid-state relay 200 comprises an interface device 350, for example of the CAN (Controller Area Network) type or the like, in particular of the opto-isolated type, having data transmission-reception terminals TX, RX connected to corresponding data transmission-reception pins $P_{TX}$, $P_{RX}$ of the microcontroller MIC. Such a CAN interface 350 is adapted to be also connected to the BMS processing unit 108 by the connection terminals CANH, CANL.

Using the CAN interface 350, which possibly includes also a transceiver communication device 351, the solid-state relay 200 is adapted to exchange current values I detected by the microcontroller MIC, the temperature information of the semiconductor switch T1 and further information useful for controlling and managing the relay itself 200 with the outside.

Moreover, the CAN interface device 350 and the respective transceiver 351 can be advantageously used during the step of manufacturing for programming the microcontroller MIC and calibrating the solid-state-relay 200 and during the step of developing and after manufacturing for connecting relay 200 either to diagnostic testers of relay 200 or to devices adapted to provide calibration programs via the connection terminals CANH, CANL.

The solid-state relay 200 in FIG. 2 further comprises an opto-isolated DC/DC converter 205 adapted to generate the power supply voltage VDD2 and the ground reference potential GND2 to be supplied to the driver device DV, to comparator 303, to the operational amplifier 301, to the microcontroller MIC and to the electronic temperature detection block 204. In particular, such a power supply voltage VDD2 and the ground reference potential GND2 are generated starting from a first power supply voltage VDD1 and a first reference ground potential GND1 applied outside the relay 200 itself.

With reference to FIG. 3, in a second embodiment of the solid-state relay of the invention, such a relay 300 comprises at least one power semiconductor switch device T1 connected between a first 1 and a second 2 electrical terminal of the relay. Such a first electrical terminal 1 is connected to a first electrical circuit portion of the above-described movement system 1000, e.g. to the cell block 102 of the battery pack 100. The second electrical terminal 2 is connected to a second electrical circuit portion of the movement system 1000, i.e. to the inverter IV of the loading assembly, by bus 101.

Such a semiconductor switch device T1 comprises drain D and source S conductive terminals connected to the first 1 and to the second 2 terminal of the solid-state relay 200 by respective welding resistances or bonding resistances $R_B$, and a command terminal or gate terminal G, respectively.

It is worth noting that the power semiconductor switch device T1, which represents the logical switch of the solid-state relay 300, is entirely similar to that described with reference to FIG. 2.

The solid-state relay 300 further comprises an electronic driving block 203, DV of the semiconductor switch device T1 adapted to generate a command signal S applied to the command terminal G to switch such a semiconductor switch device T1 from a closed/open state (ON/OFF) to an open/closed state to disconnect/connect the cell block 102 from/to the inverter IV of the loading assembly.

As discussed above, also in this embodiment, the electronic driving block 203, DV is adapted to receive an opening/closing control signal $S_E$ and to further receive an enabling/disabling signal which depends on the first signal S1 indicative of a difference of potential between the first 1 and second 2 terminals. The electronic driving block is further adapted to generate the command signal S according to the opening/closing control signal $S_E$ and the aforesaid enabling/disabling signal.

In an example of implementation, in the condition in which the opening/closing control signal $S_E$ determines the closed state of the power semiconductor switch device T1, the electronic driving block 203, DV is adapted to disable such a power semiconductor switch device T1 when the enabling/disabling signal is a disabling signal. It is worth noting that the electronic driving block 203, DV may be made as described above with reference to the relay in FIG. 2.

In particular, the electronic driving block comprises an electronic opto-isolated driving element 203 having an output terminal O1 connected to an enabling pin EN of a driver device DV having a respective output pin Po connected to the command terminal G of the semiconductor switch device T1.

Such an opto-isolated driving element 203 is adapted to supply the digital opening/closing control signal $S_E$ (logical 0) on such an output terminal O1 to enable the command signal S by the driver device DV on the command terminal G of the semiconductor switch device T1.

In greater detail, the opto-isolated driving element 203 is adapted to generate the opening/closing control signal $S_E$ according to a control signal CTRL externally applied to relay 300, e.g. applied to an input terminal IN1 of the opto-isolated driving element 203 itself. Such a control signal CTRL is, for example, generated by the processing unit BMS 108 (not shown in FIG. 3). Furthermore, the solid-state relay 300 of the invention comprises an electronic block for detecting a current I which crosses the semiconductor switch device T1.

Such a current detection block comprises a respective first electronic device 201 having a first input 3 and a second input 4 connected to said first 1 and second 2 electrical terminals, respectively. It is worth noting that, in this case, the second input 4 and the second terminal 2 are both connected to a ground reference potential GND2. In particular, such a first electronic device comprises an opto-isolated operational amplifier 201, of type known to those skilled in the art, adapted to generate the first signal S1, indicative of a potential difference between the aforesaid first 1 and second terminal 2. Such a first signal S1, in particular an analog voltage signal, is made available outside the relay 300, e.g. to the BMS processing unit 108. It is worth noting that also the electronic block for detecting current I of the solid-state relay 300 can comprise a processing unit separate from the aforesaid driving block 203, DV, which in this case may be the same BMS processing unit 108 outside the relay 300.

Advantageously, such a BMS processing unit 108 is adapted to detect the current I which crosses the semiconductor switch device T1 according to a processing performed on such a first signal S1.

In the case in which the BMS processing unit 108 detects any faults starting from the current I, in particular an overcurrent condition, the BMS unit 108 itself is adapted to disable the control signal CTRL to inhibit the command signal S applied to the command terminal G switching off the power semiconductor switch device T1. According to an embodiment, the solid-state relay 300 further comprises an electronic temperature detection block 202, 204 adapted to generate a second signal S2 indicative of a temperature of the power semiconductor switch device T1.

With reference to the example in FIG. 3, such an electronic temperature detection block comprises an opto-isolated operational amplifier 202 connected to a temperature measuring sensor 204. Such a sensor includes a thermistor, e.g. of the NTC type, connected in series to a further resistor R1 between a power supply potential VDD2 and the ground reference potential GND2. An intermediate node N between the thermistor NTC and the further resistor R1 is connected to an input 202' of the opto-isolated operational amplifier 202 to make such a second signal S2 available outside the solid-state relay 300, e.g. to the BMS processing unit 108. In particular, the aforesaid second signal S2 is an analog voltage signal.

In an alternative embodiment of the present invention, the BMS processing unit 108 is adapted to detect the current I which crosses the semiconductor switch device T1 according to a processing performed starting from the first signal S1 and the second signal S2.

Additionally, the solid-state relay 300 comprises a respective overcurrent protection circuit 303, 304 adapted to disable the command signal S on the command terminal G of the semiconductor switch device T1 when an overcurrent condition occurs. Such a protection circuit comprises a comparator device 303, e.g. an operational amplifier, having a respective first input terminal IN connected to the first electrical terminal 1 to receive the voltage between the first 1 and second 2 terminals and a second input terminal adapted to receive a threshold signal THR. Such a comparator 303 comprises a respective output OUT connected to a first input of a logical port, in particular an AND port 304, the second input of which is connected to the output terminal O1 of the opto-isolated driving element 203. It is worth noting that the logical signal on the second input of the AND port 304 is the reverse of the logical signal on the output terminal O1 of the opto-isolated driving element 203.

A respective output of the AND port 304 is connected to the disabling pin DIS of the driver device DV. Assuming that the control signal CTRL is enabled, the opening/closing control signal $S_E$ is a low logical level signal (logical 0) to enable the command signal S by the driver DV.

In this case, when the voltage between the first 1 and second 2 terminals of relay 300 is lower than the threshold THR, the comparator 303 is adapted to supply a low logical level signal (logical 0) to the first input of the AND port. Therefore, a low logical level signal (logical 0) is supplied to the disabling pin DIS of the driver device DV and the switch T1 is kept on (ON).

Conversely, if the voltage between the first 1 and second 2 terminals of relay 300 is higher than the threshold THR, comparator 303 is adapted to supply a high logical level signal (logical 1) to the first input of the AND port 304. Therefore, a high logical level signal (logical 1) is supplied in input to the disabling pin DIS of the driver device DV to disable the command signal S and switch off the power switch T1.

Thus, such a protection circuit 303, 304 implements an overcurrent protection of the hardware type of the solid-state relay 300.

The solid-state relay 300 further comprises an opto-isolated DC/DC converter 205 adapted to generate the power supply voltage VDD2 and the ground reference potential GND2 to be supplied to the driver device DV, to comparator 303, to the electronic temperature detection block 204 and to the opto-isolated operational amplifiers 201, 202. In particular, such a power supply voltage VDD2 and the ground reference potential GND2 are generated starting from a first power supply voltage VDD1 and a first reference ground potential GND1 applied outside of relay 300.

Figure 4:
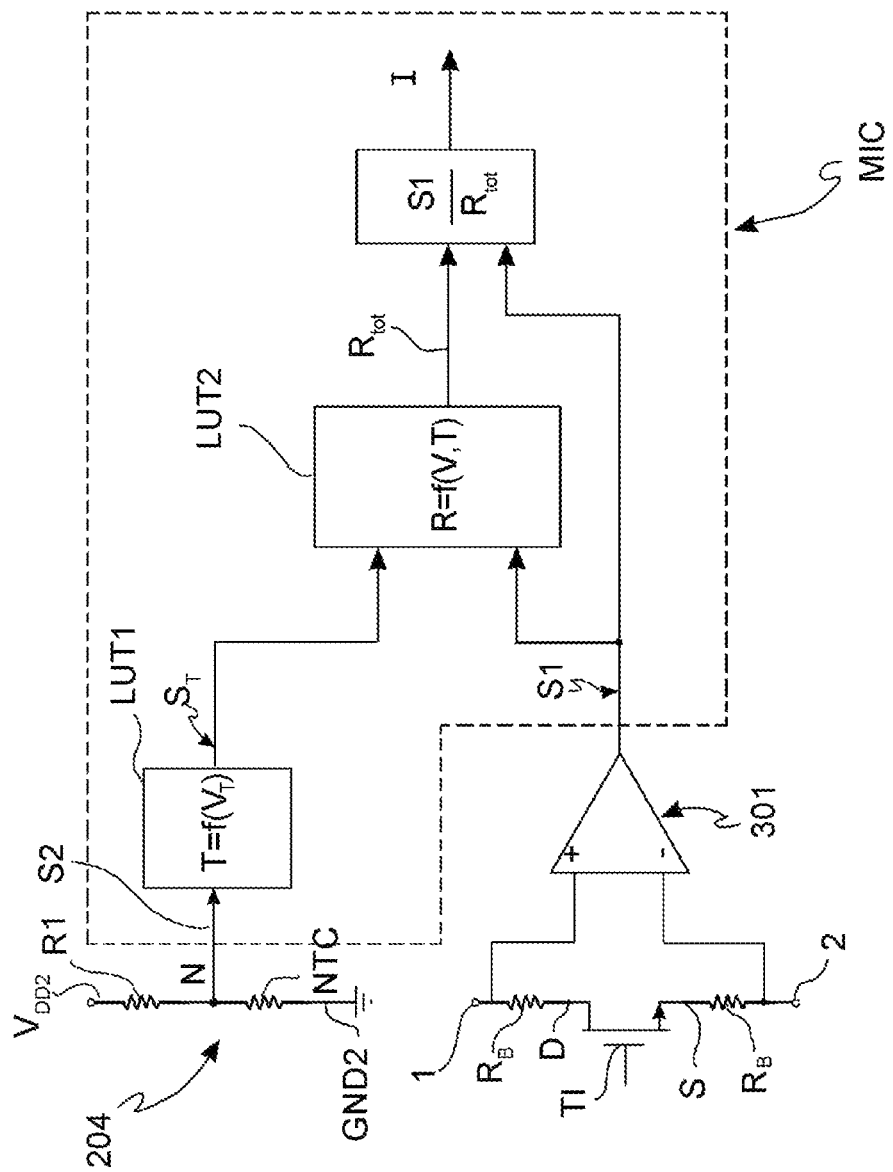
FIG. 4 diagrammatically shows functional aspects of a portion of the solid-state relay of FIG. 2.

With reference to FIG. 4, one embodiment is shown of an operating mode for detecting a current I which crosses the semiconductor switch element T1. In FIG. 4, it is assumed that the steps of the method are implemented by the microcontroller MIC (diagrammatically represented by the block with a dashed line) of the solid-state relay 200 of the invention described with reference to FIG. 2. In the solid-state relay 300 in FIG. 3, in which there is no microcontroller MIC, it is assumed that such operations are directly performed by the BMS processing unit 108.

In particular, the operational amplifier 301 measures the potential difference between the first 1 and second 2 terminals of relay 200, i.e. the sum of the voltage drop on the drain-source resistance $R_{DSON}$ of such a device T1 and the voltage drop on the two bonding resistances $R_B$ assuming that the power MOSFET T1 is in the closed state (ON). The operational amplifier 301 generates, as a consequence, the first voltage signal S1.

The temperature sensor 204 is adapted to generate the second signal S2 indicative of the temperature associated with the switch device T1, also a voltage signal. Such a second signal S2 is processed by the microcontroller MIC by use of a first pre-established look-up table LUT1, stored in a specific memory associated with the microcontroller MIC, to associate a signal $S_T$ indicative of the temperature of switch T1 with such a second voltage signal S2.

According to the first signal S1 and such a temperature signal $S_T$, the microcontroller MIC is adapted to estimate the resistance Rtot present between the aforesaid first 1 and second 2 terminals by extrapolating it from a second pre-established table LUT2 according to a characterization of the total resistance present between the first 1 and second 2 terminals of relay 200. Such a second table LUT2 is also stored in an appropriate memory of the microcontroller MIC.

According to the voltage at the terminals 1,2, i.e. S1, and the estimated resistance value Rtot, the microcontroller MIC is adapted to calculate the current I which crosses the MOSFET T1, in particular by determining the ratio between the first signal S1 and the aforesaid resistance Rtot.

In an alternative embodiment of the above-described method of detecting the current I, this can be done without the temperature information by basing the current estimation only on the acquisition of the first signal S1 and assuming to operate at constant temperature, e.g. 50° C. In such a case, the microcontroller MIC is adapted to estimate the resistance Rtot present between the aforesaid first 1 and second 2 terminals extrapolating it from a respective pre-established table LUT2' based on a characterization of the total resistance present between the first 1 and second 2 terminals of relay 200 at such a constant temperature. Advantageously, one of the bonding resistances $R_B$ of the solid-state relay 200, 300 may be adapted to operate as a fuse to protect the overall circuit of the movement system 1000 of a vehicle. In particular, according to an embodiment of relay 200, 300, such selected bonding resistance $R_B$ is sized and adapted according to a maximum current operational value used for the power semiconductor switch device T1 and according to a predetermined non-tolerable overcurrent value (which therefore must never be exceeded), which is higher than the maximum operational value. Thereby, such a bonding resistance $R_B$ works as a fuse and melts at current value between the maximum operational value and the non-tolerable overcurrent value, thus disconnecting one of the conductive terminals D or S of switch T1 from the respective first 1 or second 2 electrical terminal. Practically, this is obtained, for example, by selecting an appropriate metal alloy to make the bonding.

Moreover, such an alloy can be chosen so that it has an appropriate positive thermal coefficient. In this way, when the temperature varies, the value of the bonding resistances $R_B$ increases and a fuse function is made.

It is worth noting that the solid-state relay 200, 300 object of the invention is, for example, adapted to be included in a battery pack 100 of a movement system 1000 of a motor vehicle using a battery 102 with 48 Volt lithium cells C. In particular, a single electronic relay 200, 300 is provided on the connection line L1 at the positive terminal of the battery 102 and managed by the BMS processing unit.

One embodiment of a three-dimensional structure of the solid-state relay, e.g. of relay 200 in FIG. 2, is described below with reference to FIGS. 5A-5D. In particular, the aforesaid figures illustrate the structural components of the relay which can be connected to each other mechanically to form the structure of the solid-state relay 200. Although reference will be explicitly made hereinafter to the embodiment of the solid-state relay 200, the same considerations apply to the relay 300 described with reference to FIG. 3.

Figure 5A:
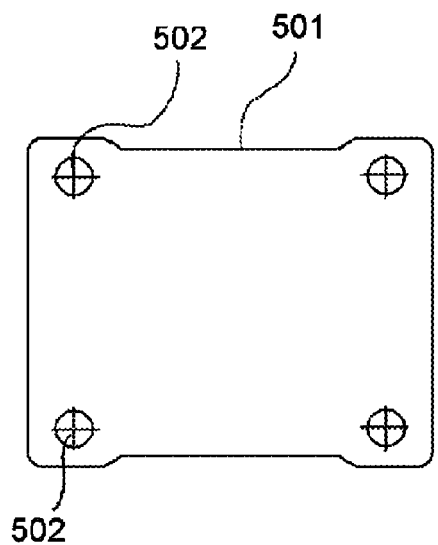
FIG. 5A shows elements forming a three-dimensional structure of an embodiment of the solid-state relay of FIG. 2.

With reference to FIG. 5A, the three-dimensional structure of the solid-state relay 200 comprises a metal support 501 formed by a substantially rectangular metal plate or foil having length of approximately 62 mm, width of approximately 55 mm and thickness of approximately 3 mm. Such a metal plate 501, which is also adapted to operate as a heat sink element of relay 200, includes through holes 502, in particular four through holes proximal to the vertexes of plate 501 each adapted to accommodate a respective fixing element for the assembly of the structure of relay 200.

Figure 5B:
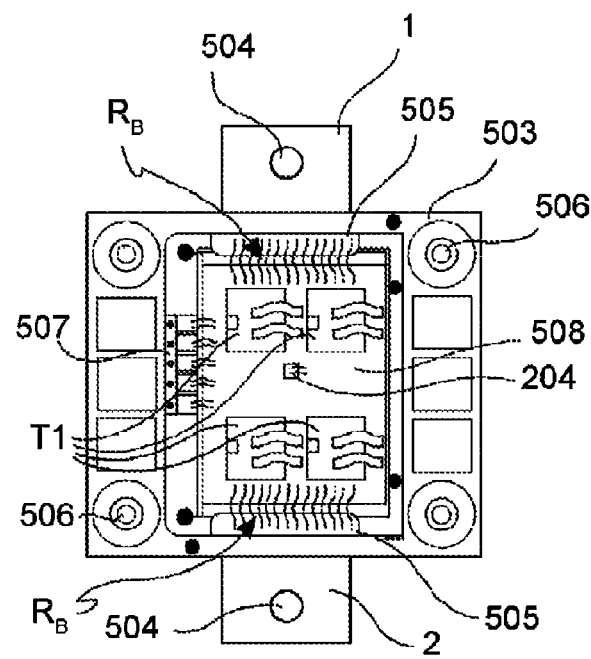
FIG. 5B shows elements forming a three-dimensional structure of an embodiment of the solid-state relay of FIG. 2.

With reference to FIG. 5B, the three-dimensional structure of the solid-state relay 200 further comprises a frame 503 which forms the main element of the structure of relay 200 and is made, for example, by co-molding of plastic material with electrical and/or mechanical type elements.

Such a frame 503 includes the first 1 and second 2 electrical terminals adapted to connect the relay 200 to the first electrical circuit portion, i.e. to the cell block 102 of the battery pack 100, and to the second electrical circuit portion, i.e. to the inverter IV of the loading assembly by the bus 101, respectively.

In greater detail, such electrical terminals 1,2 project towards the outside of the frame 503 along a same longitudinal axis of development of the frame in opposite directions and are made, for example, of enameled copper alloy. Each terminal 1,2 comprises a first threaded through hole 504 arranged in distal position from the frame 503 and a stand-alone portion 505 inside the frame 503 adapted to electrically connect, by use of metal bonds, such a terminal to the electronic devices housed in the frame 503. The metal bonds in FIG. 5B correspond to the bonding resistances $R_B$ in FIG. 2.

The plastic material frame 503 also includes fixing mechanisms, preferably fixing bushings 506, e.g. made of brass, in particular four bushings, to mechanically fix the frame 503 to a fixing structure outside relay 200. The bushings 506 are coaxial to the holes 502 of plate 501.

Furthermore, the frame 503 includes conductive elements 507 (in particular five conductive elements) adapted to make the electrical connection between a first printed circuit board (internal PCB) 508 and a second printed circuit board (external PCB) 509.

In greater detail, the first printed circuit board 508 is made, for example, on a ceramic substrate and is fixed to the frame 503. Such a first printed circuit board 508 comprises the MOSFETs which implement the power semiconductor switch device T1. Moreover, the first printed circuit board 508 comprises the electronic temperature detection block 204. In the specific example, it is assumed that switch T1 is made by four MOSFETs, a first pair of channel p MOSFETs, arranged mutually in parallel and a second pair of n channel MOSFETs arranged mutually in parallel. The first and second pairs of MOSFETs are connected to each other in series to implement the solid-state switch T1. Such a solution is suitable for applications for currents up to 400-500A. For higher currents, a corresponding solution of embodiment contemplates the use of a higher number of MOSFETs connected to each other in parallel.

Figure 5C:
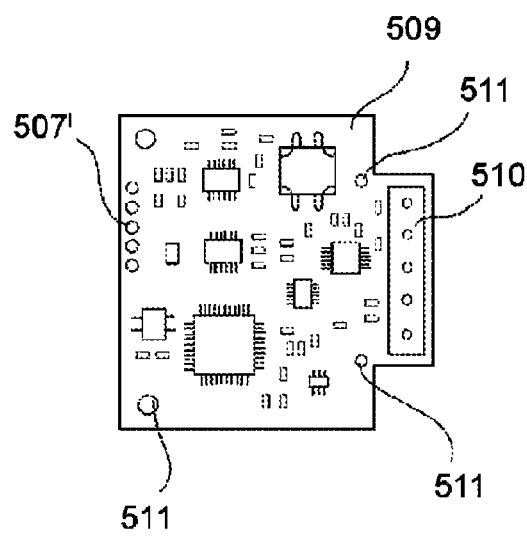
FIG. 5C shows elements forming a three-dimensional structure of an embodiment of the solid-state relay of FIG. 2.

The second printed circuit 509, distinct from the first printed circuit 508 and separate from the frame 503, is shown in FIG. 5C. Such a second printed circuit board 509 comprising, among other, the electronic driving block 203, DV and the electronic block for detecting current I and all the logical circuitry of relay 200 (e.g. the microcontroller MIC, the operational amplifiers 301, 303 and the logical ports 302, 304). Furthermore, the second printed circuit board 509 comprises an electrical connector 510, e.g. with five poles, for interfacing such logical circuits outside relay 200.

Additionally, the second printed circuit board 509 comprises respective conductive elements 507' to electrically connect the logical circuit to the power devices of the first printed circuit board 508.

Such a second printed circuit board 509 comprises further through holes 511 associated with similar holes in the frame 503 adapted to house further fixing elements for fixing such a second printed circuit 509 onto the frame 503. The second printed circuit 509 fixed to the frame 503 is superimposed on the first printed circuit board 508.

Figure 5D:
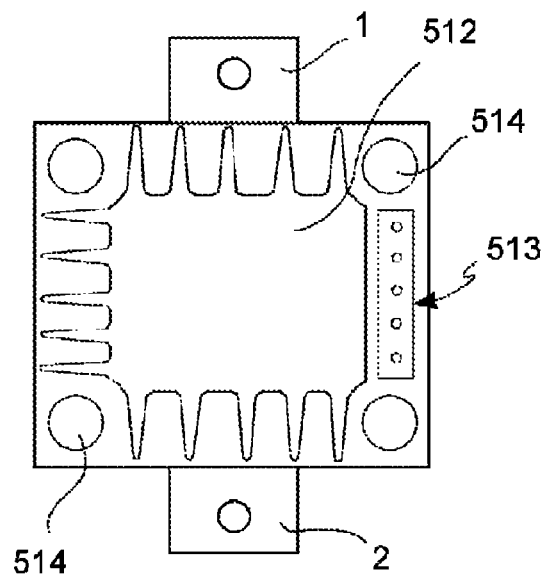
FIG. 5D shows a top view of the three-dimensional structure of the solid-state relay of FIGS. 5A-5C in an assembled configuration.

With reference to FIG. 5D, the three-dimensional structure of relay 200 further comprises a covering element or lid 512, for example of plastic material, fixed to the frame 503 to cover the other structural elements of relay 200 thus closing it. In particular, the lid 512 is adapted to house the first 508 and second 509 printed circuit boards. Such a cover 512 further comprises an appropriate compartment 513 obtained at the five-pole connector 510 of the second printed circuit board 509. The lid 512 comprises respective through holes 514, in particular four holes coaxial to the bushings 506 of the frame 503 to let such bushings pass through during the assembly.

It is worth noting that FIG. 5D shows a view from the top of the structure of the solid-state relay 200 with the lid mounted and with the first 1 and second 2 electrical terminals in FIG. 5B protruding.

The assembly method of the three-dimensional structure of the solid-state relay 200 described above comprises the following steps: the first ceramic printed circuit board 508 including the power MOSFET devices and the electronic temperature detection block 204 is fixed by welding to the metal support 501; the metal support 501 welded to the first printed circuit board 508 is fixed, in particular glued, to the frame 503; the electrical connection operation is performed by metal bonding to electrically connect the electronic devices associated with the first printed circuit board 508 to connect the latter to the conductive elements 507 of the frame 503 and to the first 1 and second 2 electrical terminal; the power circuits associated with the first printed circuit board 508 are covered with a protective gel; the second printed circuit board 509 which comprises the logic and the connector 510 is fixed to the frame 503, by use of fixing mechanism which engages the further holes 511 and the corresponding holes of the frame 503, and is then electrically connected to the frame by use of further conductive elements 507'; finally, the plastic lid 512 is inserted and glued which covers the logical part contained on the second printed circuit board 509 and encases it all.

As a whole, the solid-state relay 200 will present the two copper alloy terminals 1,2 for the electrical connection to the bus 101, the connector 510,513 of the five-pole logic (VDD1, GND1, CANH, CANL, CTRL) and four brass bushings 506 for the mechanical connection of the relay to an external heat sink (not shown in the figures). The solid-state relay 200,300 of the present invention has many advantages.

Indeed, by comprising integrated devices and being free from moving mechanical parts, such a solid-state relay 200, 300 ensures more reliability over time with respect to an electromechanical relay.

Moreover, relay 200, 300 provides a measurement of the effective potential difference between the electrical terminals 1,2 to be connected and disconnected, including the voltage drops present on the bonding resistances $R_B$ which may be variable from device to device. This allows a more accurate estimate of the current I which crosses the semiconductor switch T1 in closed state, and thus makes the protection functions more reliable and accurate.

Additionally, the relay 200, 300 of the invention may include the function of detecting the current I, by the estimate made by the microcontroller MIC or the BMS processing unit 108. This avoids needing to use a current sensor outside the movement system 1000, with considerably saving on the cost associated with such a sensor.

Such solid-state relays 200,300 which include integrated devices are smaller and lighter than the electromagnetic ones, with evident advantages in terms of weight and dimensions of the battery system.

Furthermore, the solid-state relay 300 has the advantage that such a device may be completely managed by an external device, such as for example the BMS unit 108, i.e. does not require a pre-programmed component inside, i.e. relay 300 is even simpler and less costly.

Those skilled in the art can make changes and adaptations to the embodiments of the above-described electronic solid-state relay or can replace elements with others which are functionally equivalent in order to meet contingent needs without departing from the scope of the appended claims. All the features described as belonging to one possible embodiment may be implemented independently from the other embodiments described.

The invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

The invention claimed is:

1. A solid-state relay electrically actuated to disconnect/connect a first portion of an electrical circuit from/to a second portion of said electrical circuit, comprising:
  at least one power semiconductor switch device connected between a first electrical terminal of the relay connected to said first electrical circuit portion and a second electrical terminal of the relay connected to said second electrical circuit portion, respectively, by respective conductive terminals, and having a command terminal,
  an electronic opto-isolated driving element of said at least one power semiconductor switch device adapted to generate a command signal applied to said command terminal to switch the at least one power semiconductor switch device from a closed/open state to an open/ closed state to disconnect/connect the first electrical circuit portion from/to the second portion of said electrical circuit;

an amplifier for detecting a current which crosses said at least one power semiconductor switch device, and having a first input and a second input connected to said first and second electrical terminals, respectively, adapted to generate a first signal indicative of a difference of potential between the first and second terminals generated by the current which crosses a total resistance present between the first and second terminals of the at least one power semiconductor switch device in the closed state, wherein said total resistance comprises the sum of a first resistance associated with the semiconductor switch device in the closed state and of second bonding resistances each associated with an electrical connection between one of said conductive terminals and the respective either said first or second electrical terminal, and wherein said electronic opto-isolated driving element is adapted to receive an opening/closing control signal, to further receive an enabling/disabling signal depending on said first signal, and is further adapted to generate said command signal on the basis of the opening/closing control signal and of the enabling/disabling signal.

2. The solid-state relay as set forth in claim 1, wherein when said opening/closing control signal determines the closed state of the one power semiconductor switch device, said electronic opto-isolated driving element is adapted to disable the one power semiconductor switch device when the enabling/disabling signal is a disabling signal.

3. The solid-state relay as set forth in claim 1, further comprising a processing unit operatively associated with the solid-state relay and distinct from said electronic opto-isolated driving element, said processing unit being adapted to receive the first signal to detect said current according to a processing performed on said first signal.

4. The solid-state relay as set forth in claim 3, further comprising a thermistor adapted to generate a second signal indicative of a temperature of said power semiconductor switch device, said second signal being made available to the processing unit, said processing unit being adapted to detect said current which crosses the at least one power semiconductor device in the closed state according to a processing performed starting from the first signal and the second signal.

5. The solid-state relay as set forth in claim 1, wherein one of said second bonding resistances is sized and adapted according to a predetermined maximum operational current value for the one power semiconductor switch device and to a predetermined non-tolerable overcurrent value, higher than said maximum operational value, so that said second bonding resistance operates as a fuse and melts at current values between the maximum operational value and the overcurrent value, thus disconnecting one of the conductive terminals from the respective either first or second electrical terminal.

6. The solid-state relay as set forth in claim 4, wherein said electronic opto-isolated driving element includes an output terminal connected to an enabling pin of a driver device, said driver device being provided with an output pin connected to the command terminal of the one power semiconductor switch device, said electronic opto-isolated driving element being adapted to generate the opening/closing control signal according to a control signal applied to the solid-state relay from the outside.

7. The solid-state relay as set forth in claim 6, wherein said processing unit comprises a microcontroller having:
a first input pin connected to an output of the amplifier to receive the aforesaid first signal;
a second input pin connected to a first output of the thermistor to receive the aforesaid second signal;
an output pin operatively connected to a disabling pin of the driver device by a first logical port to supply a third signal to said disabling pin.

8. The solid-state relay as set forth in claim 7, wherein said first logical port is an OR logical port with two inputs having one of the two inputs connected to the output pin of the microcontroller and an output connected to the disabling pin of the driver device.

9. The solid-state relay as set forth in claim 4, wherein said thermistor is connected in series to a further resistor between a power supply potential and a ground reference potential of the relay, the second signal being made available on an intermediate output node between said thermistor and the further resistor.

10. The solid-state relay as set forth in claim 7, further comprising an overcurrent protection circuit which comprises:
a comparator device, having a respective first input terminal connected to the output of the amplifier to receive said first signal and a second input terminal adapted to receive a threshold signal, said comparator comprising a respective output terminal;
a second logical port with two inputs, having a first input connected to the respective output terminal of the comparator and a second input terminal connected to the output terminal of the opto-isolated driving element.

11. The solid-state relay as set forth in claim 10, wherein said second logical port is an AND port adapted to receive, on the second input, the reverse of the logical signal present on the output terminal of the opto-isolated driving element.

12. The solid-state relay as set forth in claim 7, further comprising an opto-isolated interface device having data transceiver terminals connected to corresponding data transceiver pins of the microcontroller.

13. The solid-state relay as set forth in claim 6, further comprising an overcurrent protection circuit which comprises:
a comparator device, having a respective first input terminal connected to the first electrical terminal to receive the voltage between the first and second terminals and the second input terminal adapted to receive a threshold signal, said comparator comprising a respective output terminal;
a logical port with two inputs, having a first input connected to the respective output terminal of the comparator and a second input terminal connected to the output terminal of the opto-isolated driving element.

14. The solid-state relay as set forth in claim 13, wherein said logical port is an AND port adapted to receive, on the second input, the reverse of the logical signal present on the output terminal of the opto-isolated driving element and having a respective output connected to the driver device.

15. The solid-state relay as set forth in claim 4, wherein said
thermistor is connected in series to a further resistor between a power supply potential and a ground reference potential of the relay, such a second signal being available on an output node which is in intermediate position between said thermal resistance and the further resistor;

an opto-isolated operational amplifier having a respective input connected to said intermediate output node to receive said second signal to be made available outside the relay.

16. The solid-state relay as set forth in claim 1, wherein said at least one power semiconductor switch device includes two or more power MOSFET devices connected to each other in parallel and/or in series.

17. A movement system of an electric or hybrid traction vehicle, comprising:
   a loading assembly adapted to generate the motion;
   an electric charge source assembly or battery pack for storing the electrical energy, electrically connected to the loading assembly by a direct current bus;
   at least one solid-state relay to disconnect/connect said electric charge source assembly from/to the loading assembly in a controlled manner, said relay comprising at least one power semiconductor switch device connected between a first electrical terminal of the relay connected to said first electrical circuit portion and a second electrical terminal of the relay connected to said second electrical circuit portion, respectively, by respective conductive terminals, and having a command terminal,
   an electronic opto-isolated driving element of said at least one power semiconductor switch device adapted to generate a command signal applied to said command terminal to switch the at least one semiconductor switch device from a closed/open state to an open/closed state to disconnect/connect the first electrical circuit portion from/to the second portion of said electrical circuit;
   an amplifier that detects a current which crosses said at least one power semiconductor switch device
   and having a first input and a second input connected to said first and second electrical terminals, respectively, adapted to generate a first signal indicative of a difference of potential between the first and second terminals generated by the current which crosses a total resistance present between the first and second terminals of the at least one power semiconductor switch device in the closed state,
   wherein said total resistance comprises the sum of a first resistance associated with the semiconductor switch device in the closed state and of second bonding resistances each associated with an electrical connection between one of said conductive terminals and the respective either said first or second electrical terminal,
   and wherein said electronic opto-isolated driving element is adapted to receive an opening/closing control signal, to further receive an enabling/disabling signal depending on said first signal, and is further adapted to generate said command signal on the basis of the opening/closing control signal and of the enabling/disabling signal.

18. The solid-state relay as set forth in claim 1, further including:
   a frame including said first and second electrical terminals to connect the relay to the first portion of the electrical circuit and to the second electrical circuit portion, respectively;
   a first printed circuit fixed to the frame, said first printed circuit comprising said at least one power semiconductor switch device;
   a second printed circuit comprising said electronic opto-isolated driving element and said amplifier, said second printed circuit being fixed to the frame so as to be superimposed on the first printed circuit;
   a metal support, said first printed circuit being fixed to the metal support to be fixed to the frame.

19. The solid-state relay as set forth in claim 18, further comprising a covering element fixed to the frame and adapted to house said first and second printed circuit.

20. The solid-state relay as set forth in claim 18, wherein said frame is made by co-molding plastic material with electrical and/or mechanical type elements.

21. The solid-state relay as set forth in claim 18, wherein the at least one power semiconductor switch device is electrically connected to the first and second electrical terminals by said electrical bonding connections and to conductive elements provided in the frame,
   and wherein said second printed circuit further comprises:
   first conductive elements adapted to be electrically connected to the conductive elements of the frame,
   an electrical connector to interface the electronic opto-isolated driving element and the amplifier with outside the relay.

* * * * *